US005880482A

United States Patent [19]
Adesida et al.

[11] Patent Number: 5,880,482
[45] Date of Patent: Mar. 9, 1999

[54] LOW DARK CURRENT PHOTODETECTOR

[75] Inventors: Ilesanmi Adesida; Walter Wohlmuth, both of Champaign; Mohamed Arafa; Patrick Fay, both of Urbana, all of Ill.

[73] Assignee: The Board of Trustees of the University of Illinios, Urbana, Ill.

[21] Appl. No.: 790,653

[22] Filed: Jan. 29, 1997

[51] Int. Cl.⁶ .......................... H01L 29/06; H01L 31/00; H01L 31/0328; H01L 31/0336
[52] U.S. Cl. ........................... 257/21; 257/189; 257/459; 257/466
[58] Field of Search ..................... 438/59, 237; 257/184, 257/189, 21, 466, 459

[56] References Cited

U.S. PATENT DOCUMENTS

| | | | |
|---|---|---|---|
| 4,998,154 | 3/1991 | Surridge et al. | 357/30 |
| 5,208,821 | 5/1993 | Berger et al. | 372/48 |
| 5,212,395 | 5/1993 | Berger et al. | 257/185 |
| 5,225,696 | 7/1993 | Bahraman | 259/291 |
| 5,512,763 | 4/1996 | Allam | 257/21 |

OTHER PUBLICATIONS

Walter A. Wohlmuth, Patrick Fay, Ilesanmi Adesida and Catherine Caneau, "Low Dark Current, Long Wavelength Metal–Semiconductor Metal Photodetectors," *Abstract.* Eighth International Conference on Indium Phosphide and Related Materials, Schwabisch–gmund, Germany, Apr. 1996.

Walter A. Wohlmuth, Patrick Fay, Catherine Caneau and Ilesanmi Adesida, "Low Dark Current, Long Wavelength Metal–Semiconductor Metal Photodetectors," Electronics Letters, vol. 32, No. 3, pp. 249–250, Feb. 1, 1996.

Walter A. Wohlmuth, Patrick Fay and Ilesanmi Adesida, "Dark Current Suppression in GaAs Metal–Semiconductor– Metal Photodetectors," IEEE Photonics Technology Letters, vol. 8, No. 8, pp. 1061–1063, Aug. 1996, H.S. Fresser, F.E. Prins and D. P. Kern, "Low–Energy Electron Detection in Microcolumns," J. Vac. Sci. Technology, B, vol. 13, No. 6, published Nov./Dec. 1995, pp. 2553–2555.

Wei Gao, et al., "$In_{0.53}Ga_{0.47}$ As Metal–Semiconductor– Metal Photodiodes With Transparent Cadmium Tin Oxide Schottky Contacts," Appl. Phys. Lett., vol. 65, No. 15, pp. 1930–1932, Oct. 10, 1994.

Paul R. Berger, et al., "$In_{0.53}Ga_{0.47}$ As P–I–N Photodiodes With Transparent Cadmium Tin Oxide Contacts,"Appl. Phys. Lett., vol. 61, No. 14, pp. 1673–1675, Oct. 5, 1992.

Wei Gao, et al., "Transparent and Opaque Schottky Contacts On Undoped $In_{0.52}Al_{0.48}$ As Grown By Molecular Beam Epitaxy," Appl. Phys. Lett., vol. 66, No. 25, pp. 3471–3473, Jun. 19, 1995.

Jong–Wook Seo, et al., "A Comparative Study of Metal– Semiconductor–Metal Photodetectors on GaAs With Indium–Tin–Oxide and Ti/Au Electrodes," IEEE Photonics Technology Letters, vol. 4, No. 8, pp. 888–890, Aug., 1992.

J. Lee Russell, et al., "Improved InP/InGaAs/InP Pin Detector Response Using A Transparent Conductor Contact," Electronics Letters, vol. 26, No. 16, pp. 1231–1232, Aug. 2, 1990.

(List continued on next page.)

*Primary Examiner*—Brian Dutton
*Attorney, Agent, or Firm*—Fitch, Even, Tabin & Flannery

[57] ABSTRACT

A low dark current metal-semiconductor-metal photodetector has an active region for receiving photons and generating charge carriers in the form of holes and electrons in response to the photons and an isolation region for allowing electrical coupling to occur without increasing the dark current. The photodetector is a III–V ternary semiconductor having its active region defined by a via through a dielectric layer. A pair of electrodes has contact portions extending into contact with the active region and terminating on the isolation region. One electrode of the pair provides a high Schottky barrier to holes. The other electrode provides a high Schottky barrier for electrons

22 Claims, 10 Drawing Sheets

OTHER PUBLICATIONS

W. A. Wohlmuth, et al., "InGaAs Metal–Semiconductor–Metal Photodetectors With Engineered Schottky Barrier Heights," Appl. Phys. Lett., vol. 69, No. 23, pp. 3578–3580, Dec. 2, 1996.

Walter A. Wohlmuth and Ilesanmi Adesida, "Long–Wavelength Metal–Semiconductor–Metal Photodetectors With Transparent and Opaque Electrodes," Society of Photo–Optical Instrumentation Engineers, vol. 2550, pp. 256–265, Jul., 1995.

Walter Wohlmuth, et al., "Engineering The Schottky Barrier Heights In InGaAs Metal–Semiconductor–Metal Photodetectors," Society of Photo–Optical Instrumentation Engineers, vol. 3006, pp. 52–60, Feb., 1997.

Walter Wohlmuth, et al., "InGaAs Metal–Semiconductor–Metal Photodetectors With A Hybrid Combination of Transparent And Opaque Electrodes," Applied Physics Letters, vol. 70, No. 23, to be published Jun. 2, 1997.

Walter A. Wohlmuth, et al., "Low Dark Current InAlAs/InGaAs Metal–Semiconductor–Metal Photodetectors," Proceedings of Eighth International Conference on Indium Phosphide and Related Materials, pp. 199–202, (1996). No month.

M. Porges, et al., "Asymmetric (Schottky–Ohmic) MSM Photodetector," Solid–State Electronics, vol. 38, No. 2, pp. 425–427 (1995). No month.

C. R. Crowell and V. L. Rideout, "Normalized Thermionic–Field (T–F) Emission in Metal–Semiconductor (Schottky) Barriers," Solid–State Electronics, vol. 12, pp. 89–105, Pergamon Press, 1969. No month.

M. Klingenstein and J. Kuhl, "Photocurrent Gain Mechanisms in Metal–Semiconductor–Metal Photodetectors," Solid–State Electronics, vol. 37, No. 2, pp. 333–340, (1994). No month.

K. L. Chopra, et al., "Transparent Conductors—A Status Review," Thin Solid Films—Electronics and Optics, vol. 102, pp. 1–46 (1983). No month.

S.M. Sze, et al., "Current Transport in Metal–Semiconductor–Metal (MSM) Structures," Solid–State Electronics, vol. 14, pp. 1209–1218, Pergamon Press (1971). No month.

Masanori Ito and Osamu Wada, "Low Dark Current GaAs Metal–Semiconductor–Metal (MSM) Photodiodes Using $WSi_x$ Contacts," IEEE Journal of Quantum Electronics, vol. QE–22, No. 7, pp. 1073–1077, Jul. 1986.

E. Sano, et al., "Performance Dependence of InGaAs MSM Photodetectors On Barrier–Enhancement Layer Structures," Electronics Letters, vol. 28, No. 13, pp. 1220–1221, Jun. 18, 1992.

Dennis L. Rogers, "Integrated Optical Receivers Using MSM Detectors," Journal of Lightwave Technology, vol. 9, No. 12, pp. 1635–1638, Dec., 1991.

John E. Bowers and Charles A. Burrus, Jr., "Ultrawide–Band Long–Wavelength P–I–N Photodetectors," Journal of Lightwave Technology, vol. LT–5, No. 10, pp. 1339–1350, Oct., 1987.

D. Kuhl, et al., "High–Speed Metal–Semiconductor–Metal Photodetectors on InP:Fe," IEEE Photonics Technology Letters, vol. 2, No. 8, pp. 574–576, Aug., 1990.

I. Adesida, et al., "Long Wavelength Metal–Semiconductor–Metal Photodetectors with Ti/Au and Indium–Tin–Oxide Electrodes," Indium Phosphide and Related Materials Conference Proceedings, pp. 284–287 (1994). No month.

Toshiki Ishida, et al., "Bias Dependence of Schottky Barrier Height in GaAs from Internal Photoemission and Current–Voltage Characteristics," J. Appl. Phys., vol. 74, No. 6, pp. 3977–3982, Sep. 15, 1993.

D. H. Lee, et al., "A Study of Surface Passivation on GaAs and $In_{0.53}Ga_{0.47}$ As Schottky–Barrier Photodiodes Using $SiO_2$, $Si_3N_4$ and Polyimide," IEEE Transactions on Electron Devices, vol. 35, No. 10, pp. 1695–1696, Oct., 1988.

U. Schade, et al., "Improved Performance of Large–Area InP/InGaAs Metal–Semiconductor–Metal Photodetectors by Sulfur Passivation," Appl. Phys. Lett., vol. 64, No. 11, pp. 1389–1391, Mar. 14, 1994.

Winston K. Chan, et al., "High–Speed $Ga_{0.47}In_{0.53}$ As MISIM Photodetectors With Dielectric–Assisted Schottky Barriers," IEEE Electron Device Letters, vol. 10, No. 9, pp. 417–419, Sep., 1989.

Jae H. Kim, et al., "High–Performance Back–Illuminated InGaAs/InAlAs MSM Photodetector With a Record Responsivity of 0.96 A/W," IEEE Photonics Technology Letters, vol. 4, No. 11, pp. 1241–1244, Nov., 1992.

A. Salvador, et al., "Resonant Cavity Enhanced InP/InGaAs Photodiode on Si Using Epitaxial Liftoff," Appl. Phys. Lett., vol. 65, No. 15, pp. 1880–1882, Oct. 10, 1994.

Julian B. D. Soole and Hermann Schumacher, "Transit–Time Limited Frequency Response of InGaAS MSM Photodetectors," IEEE Transactions on Electron Devices, vol. 37, No. 11, pp. 2285–2291, Nov., 1990.

Il Ki Han, et al., "Low Dark Current and High–Speed Metal–Semiconductor–Metal Photodetector on Sulfur–Treated InP," Jpn. J. Appl. Phys., vol. 33, Part 1, No. 12A, pp. 6454–6457, Dec. 1994.

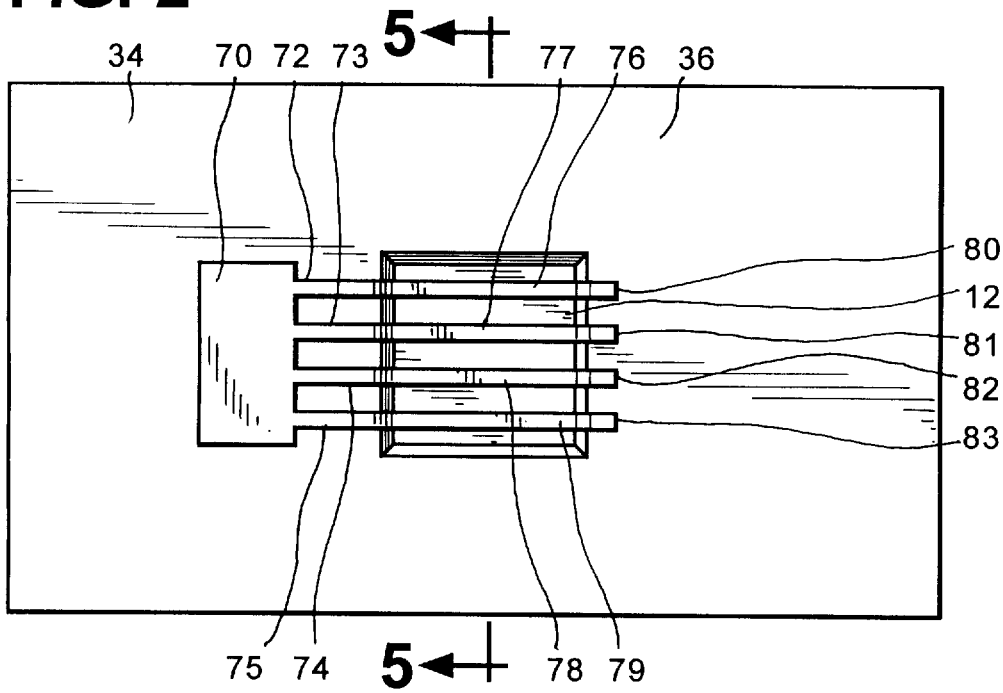
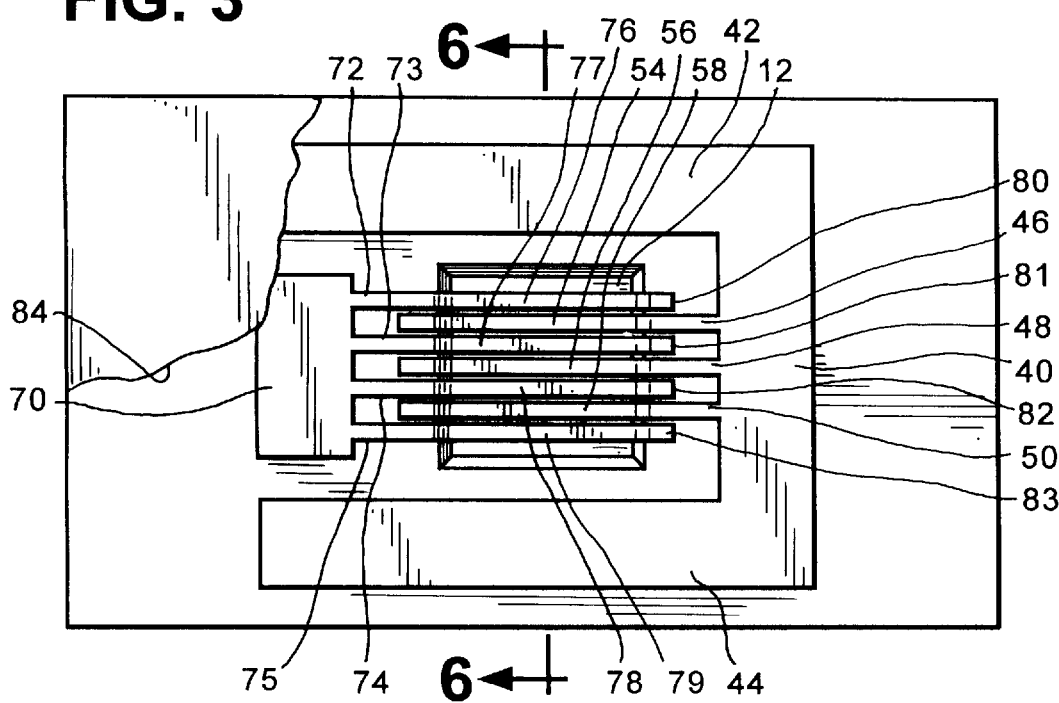

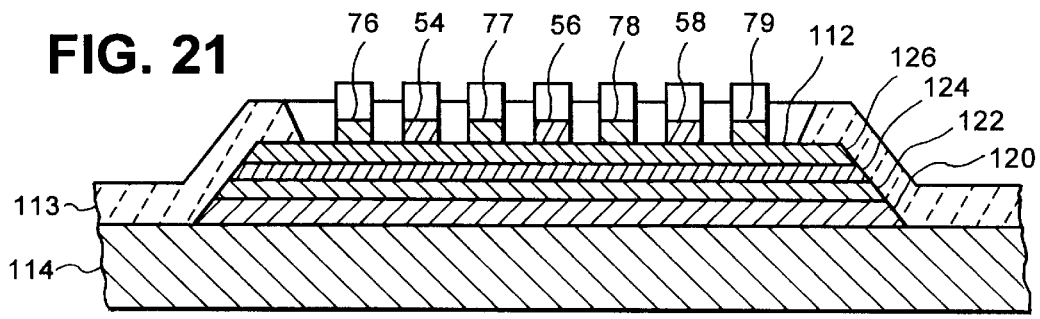
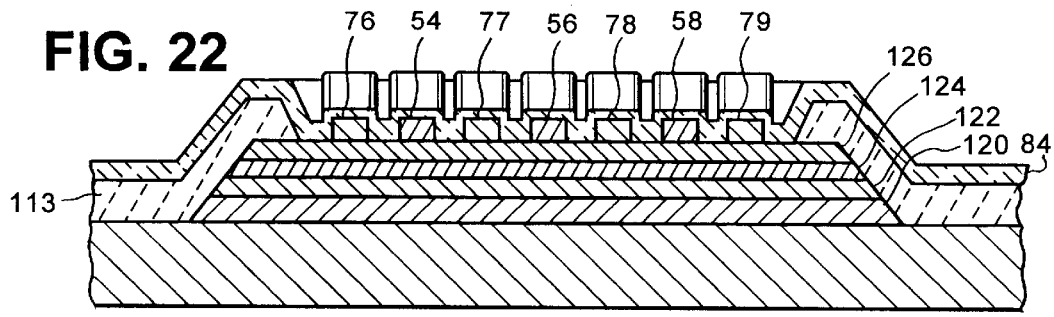

LOW DARK CURRENT PHOTODETECTOR

BACKGROUND OF THE INVENTION

The invention relates in general to a low dark current long wavelength metal-semiconductor-metal photodetector and in particular to a low dark current indium aluminum arsenide/indium gallium arsenide (InAlAs/InGaAs) interdigitated metal-semiconductor-metal (MSM) photodetector.

Metal-semiconductor-metal interdigitated photodetectors employing ternary III–V structures are well known in the art. Such structures often use InAlAs and InGaAs as detector and buffer material. One of the problems with such systems is that it is important to provide high speed and high sensitivity along with a good signal-to-noise-ratio. The signal-to-noise-ratio is degraded by noise contributed via such factors as background and dark current.

In a photodetector electrodes on a surface are biased to sweep out charge carriers produced by photon absorption. Dark current occurs at the electrodes by various thermionic and tunneling emission effects which cause current to flow in the III–V ternary photodetector to other electrodes. Unfortunately, however, the low efficiency of prior art devices, in part caused by the relatively high dark currents, is undesirable and leads to low signal noise ratios.

There have been attempts to improve the signal-to-noise-ratio of the devices by improving the amount of light which reaches the active region. The active or photoresponsive regions of the metal-semiconductor-metal devices are defined either by a mesa or by a 200 nanometer thick silicon nitride film positioned in the contact layer. For instance, in Seo, J. W. et al., "A Comparative Study of Metal-Semiconductor Metal-Photodetectors on GaAs with Indium-Tin-Oxide and Ti/Au Electrodes," IEEE Photonics Technology Letters, Vol. 4, No. 8, Aug. 1992; devices are disclosed including indium tin oxide as a transparent electrode material having a relatively high electrical conductivity and low optical absorption coefficient. Those devices, however, exhibit a relatively high dark current. While they provide some improvement in the signal-to-noise-ratio, they do not provide significant reduction of the dark current. Other attempts have been made to use transparent electrodes to improve efficiency, for instance, in "Improved InP/InGaAs/InP PIN Detector Response Using a Transparent Conductor Contact," Electronics Letters, Aug. 2, 1990, Volume 26, No. 16.

Thus, what is needed is an improved low dark current photodetector for providing an enhanced signal-to-noise-ratio.

SUMMARY OF THE INVENTION

InAlAs/InGaAs interdigitatedmetal-semiconductor-metal (MSM) photodetectors are important components for integrated optoelectronic receivers owing to their high speed performance, large signal-to-noise-ratio, and integrability with field-effect transistor technology. The sensitivity of a photodetector is determined by the signal-to-noise-ratio, as follows:

$$SNR = \frac{\frac{1}{2} GI_p^2}{2q(I_p + I_d)GFB + 4kTB/R_{eq}}$$

where: $I_p$ is the photocurrent, $I_d$ is the dark current, B is the bandwidth, k is Boltzmann's constant, G is the gain, F is the noise factor, $R_{eq}$ is the equivalent resistance, and T is the equivalent resistance temperature. Since the signal-to-noise-ratio of photodetectors is inversely proportional to the dark current it is important to devise techniques for reducing the dark current while maintaining high speed performance.

Previous attempts at reducing the dark current of InAlAs/InGaAs MSMs have focused on enhancing the Schottky barrier height by incorporated lattice-matched InP:Fe or InAlAs Schottky contact layers. However, the present invention isolates the electrode tips and contact pads from the Schottky layer and produces enhanced effects on the dark current breakdown characteristics and frequency response of InAlAs/InGaAs MSMs.

InAlAs/InGaAs lattice-matched epitaxial layers are grown by organo-metallic vapor phase epitaxy (OMVPE) on top of a (100) InP:Fe substrate. The layer structure comprises a 1,000 Å InAlAs buffer layer grown on top of the substrate. A one micron InGaAs absorption layer is positioned on top of the buffer layer. A 500 Å graded InGaAlAs layer and a 500 Å thick InAlAs Schottky barrier enhancement layer complete the semiconductor. The graded layer is incorporated into the structure to reduce carrier trapping at the InAlAs/InGaAs band edge discontinuity. However, this has been shown to degrade the high frequency performance of InAlAs/InGaAs metal-semiconductor-metal photodetectors The active or photoresponsive regions of the metal-semiconductor-metal devices are defined either by a mesa or by a 200 nanometer thick silicon nitride film positioned on the contact layer. Portions of electrodes are formed on the silicon nitride film and other portions through a via cut in the film on the active region.

The dark currents of InAlAs/InGaAs metal-semiconductor-metal photodetectors with 2 micron electrode width and spacing (2 micron by 2 micron) and a 50 by 50 micron squared active area are significantly lower than in prior art systems. The dark current yielded by conventional design is reduced by reducing leakage between the contact pads. Tunneling and thermionic emission are also reduced at previously high field regions which otherwise would have been associated with the electrode tip/semiconductor-Schottky interface.

The present invention provides a dark current density for a 2 micron by 2 micron and 50 by 50 micron squared devices of 0.13 picoamperes per square micron at a bias of 5 volts. This is approximately four times lower than the previously reported record of 0.56 picoamperes per square micron for a 150 micron diameter 1.5 micron by 1.5 micron device biased at 5 volts. The dark current density of 3 micron by 3 micron and 50 by 50 micron squared devices was found to be 0.11 and 0.34 picoamperes per square micron at biases of 5 volts and 10 volts, respectively. This is approximately 25 times lower than the previously recorded minimum for 3 micron by 3 micron metal-semiconductor-metal photodetector with the same active area dimensions.

In addition, in order to provide further reduction in the dark current, the device includes a first electrode set comprised of electrode materials which are substantially transparent, in particular, cadmium tin oxide which is substantially transparent to infrared radiation at 1.55 microns and which raises the Schottky barrier energy to electrons at the Schottky interface. The other electrodes were titanium gold electrodes. Both of the contact pads for the electrodes are positioned on a silicon nitride layer having a via cut in it to expose the active region of the MSM devices. In addition, the electrode tips terminating opposite the contact pads are positioned on the silicon nitride layer. These devices can be formed with a mesa active region for the purpose of isolation from adjacent devices or without a mesa active region.

It is a principal object of the present invention to provide a metal-semiconductor-metal photodetector having low dark current by providing and a high signal-to-noise-ratio by providing at least one transparent electrode having a material different than the other electrode, with one electrode providing a relatively high Schottky barrier for holes, the other electrode providing a relatively high Schottky barrier for electrons.

It is another object of the present invention to provide a metal-semiconductor-metal photodetector having its active region isolated from contact pads and electrode tips to reduce dark current flow caused from the contact pads and electrode tips caused by thermionic emission and tunneling.

Other objects and purposes of this invention will become obvious to one of ordinary skill in the art upon a perusal of the following specification and claims in light of the accompanying drawings.

BRIEF DESCRIPTION OF THE DRAWINGS

FIG. 2 is an elevational view of the photodetector shown in FIG. 1 without having been completed and showing details of a first electrode supported on a dielectric over a via;

FIG. 3 is an elevational view of the completed structure shown in FIG. 1;

FIG. 21 shows a second set of electrodes deposited on the active region of the mesa;

FIG. 22 shows a passivated mesa region;

DETAILED DESCRIPTION OF THE PREFERRED EMBODIMENTS

Figure 1:
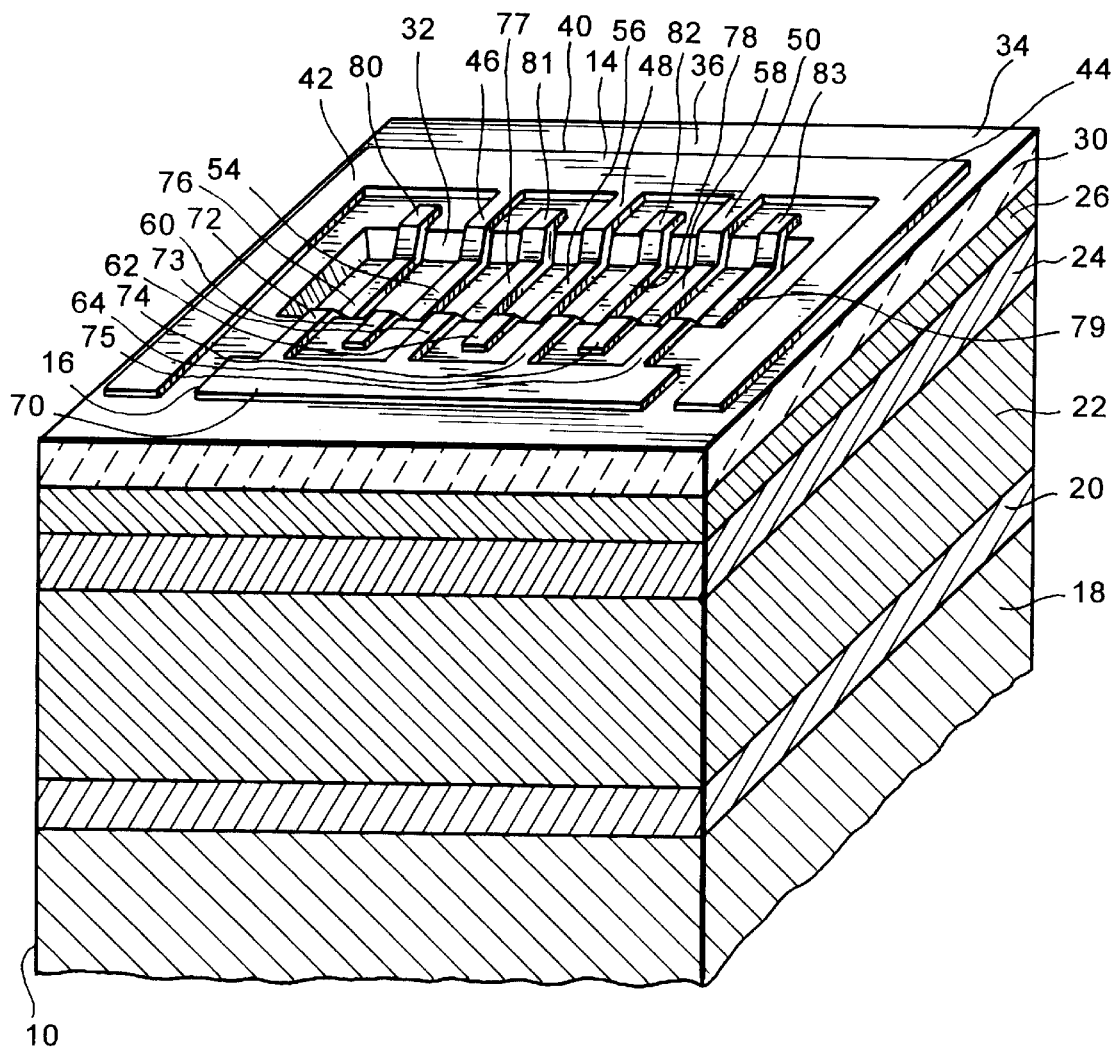
FIG. 1 is a perspective of a low dark current metal-semiconductor-metal photodetector embodying the present invention.

A low dark current metal-semiconductor-metal photodetector embodying the present invention is shown in FIG. 1 and generally identified by reference numeral 10. The metal-semiconductor-metal low dark current photodetector 10 includes an active region 12 having in contact therewith a portion of a first electrode set 14 comprised of cadmium tin oxide and substantially transparent to 1.55 micron infrared radiation and a second electrode set 16 comprised of titanium and gold. The photodetector 10 includes an indium phosphide substrate 18 doped with iron for providing lattice constant spacing for other epitaxial layers. A 100 nanometer InAlAs buffer layer 20 is formed by organo-metallic vapor phase epitaxy and/or molecular beam epitaxy on the doped indium phosphide substrate layer 18 to provide electrical isolation from the doped layer 18. An absorption layer 22 comprising InGaAs and having a thickness of about one micron is formed by organo-metallic vapor phase epitaxy and/or molecular beam epitaxy on the InAlAs buffer layer 20. A graded In(Ga, Al)As layer 24 having a thickness of about 50 nanometers is formed by organo-metallic vapor phase epitaxy and/or molecular beam epitaxy on the InGaAs layer 22. An InAlAs contact layer 26 having a thickness of about 50 nanometers is formed on the graded layer 24. A first silicon nitride layer 30 is formed on the InAlAs layer 26 for providing a well 32 which defines the active region 12. The first silicon nitride layer 30 also defines an isolation region having reduced dark current due to the low electric field presented by the electrodes 14 and 16. The via 32 is formed by conventional etching techniques. The silicon nitride layer has a thickness of about 200 nanometers and is formed by plasma-enhanced chemical vapor deposition from silane and ammonium.

It may be appreciated that not only is the active region 12 defined by the well 32 of the silicon nitride layer 30 but an upper surface 34 of the entire silicon nitride layer comprises an isolation region 36. The cadmium tin oxide electrode 14 is substantially transparent to infrared radiation at 1.55 microns and while having a higher resistance than a pure metal electrode is conductive. The electrode 14 includes a crossbar pad 40 having a first leg 42 and a second leg 44 formed in conductive connection therewith. A plurality of fingers 46, 48 and 50 extend across the silicon nitride layer from the crossbar 40 to contact portions 54, 56 and 58 which are in contact at the active region. Contact portion 54 terminates at a tip 60, contact portion 56 terminates at a tip 62 and contact portion 58 terminates at a tip 64. It may be appreciated that at such tips 60 through 64 the electric field bunching is likely to occur. The silicon nitride layer holds the tips 60 through 64 away from the active region thereby reducing the electric field strength by the separation distance therebetween and further provides a dielectric barrier further reducing the electric field strength. This helps to avoid dark currents being induced by electric field bunching at the tips. Likewise, the electrode 16 includes a crossbar 70 having a pair of electrode fingers 72, 73, 74 and 75 connected thereto with respective contact portions 76, 77, 78 and 79 terminating at tip portions 80, 81, 82 and 83. It may be appreciated that tip portions 80, 81, 82 and 83 likewise are held away from the active region by the silicon nitride layer to provide isolation; thus, all of the tip portions of the electrodes are in the isolation region and not in the active region to help reduce the dark current. In addition, one of the electrodes has a high Schottky barrier for holes when in contact with the active region. The other exhibits a high Schottky barrier for electrons when in contact with the active region, thus further reducing the dark current. In order to provide high speed performance the electrode 16 is made from titanium and gold, having very low resistance, while the differing electrode 14 is transparent to infrared radiation increasing the radiation throughput to the active region while providing a complementary Schottky barrier structure.

Figure 4:
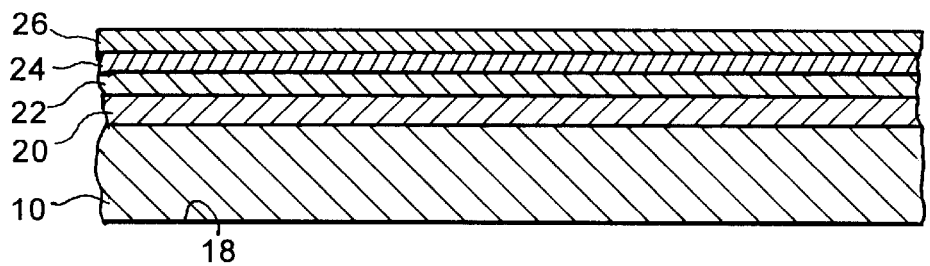
FIG. 4 is a sectional view taken substantially along line 6—6 of FIG. 3 showing details of a substrate having semiconducting layers thereon.

The devices are fabricated on undoped lattice-matched epitaxial layers grown by organo-metallic vapor phase epitaxy and/or molecular beam epitaxy on a InP:Fe substrate. The layer structure includes, e.g., a 100 nm InAlAs buffer layer 20, a 1.0 μm InGaAs absorption layer 22, a 50 nm InAlAs/InGaAs digitally graded layer 24, and a 50 nm InAlAs Schottky barrier enhancement layer 26. The graded layer 24 is incorporated into the structure to eliminate conduction and valence band discontinuities that have been shown to degrade the high frequency performance. This layer structure and the electrode structure of contact layer 26 of the metal-semiconductor-metal photodetector is shown in FIGS. 1 and 4, as described above. The Schottky contacts include a film of Ti:Au for the anode and a thick film of cadmium-tin-oxide (approximately 160 nm) for the cathode. The electrode geometry of the described hybrid metal-semiconductor-metal photodetectors have electrodes of about 0.5 μm Ti:Au and 2.0 μm cadmium-tin-oxide electrodes; with approximately a 2.0 μm electrode spacings and an active area of about 50×50 μm$^2$.

The cadmium-tin-oxide film is deposited by r.f. magnetron sputtering in an Argon environment from a composite target containing by weight, approximately, 90% CdO and 10% SnO$_2$. The film thickness was chosen to be a quarter wavelength (λ/4). Thus, for 1.31 μm light this corresponds to a thickness of 160 nm given a refractive index of 2.05. The cadmium-tin-oxide electrodes were delineated by reactive ion etching. A one minute anneal at 400° C. in a nitrogen ambient may reduce the damage incurred during the reactive ion etching process and lower the resistivity of the cadmium-tin-oxide electrodes. The Ti:Au electrodes are defined using a liftoff process. The cadmium-tin-oxide film transmits approximately 88% of perpendicularly incident light in the 1.3 to 1.55 μm wavelength range. The Schottky barrier height of cadmium-tin-oxide on undoped In$_{0.52}$Al$_{0.48}$As is about 0.905 eV from current-voltage measurements and 0.95 eV from current-voltage-temperature measurements. A reflective film of TI:Au (e.g., 20:180 nm) may be deposited on the polished backside of the wafer to enhance the optical collection efficiency. Silicon nitride material layer 84 is used as the anti-reflection coating and passivation material because the square root of the index of refraction of the semiconductor layers times the refractive index of air is approximately equal to the refractive index of silicon nitride. The silicon nitride film thickness of approximately 200 nm is chosen to be identical to the silicon nitride insulating layer thickness.

Figure 5:
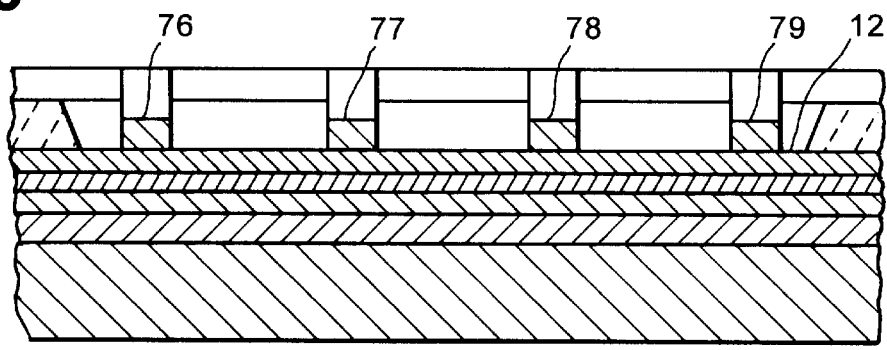
FIG. 5 is a cross-sectional view of the semiconductor shown in FIG. 4 with a first set of electrodes formed thereon.
Figure 6:
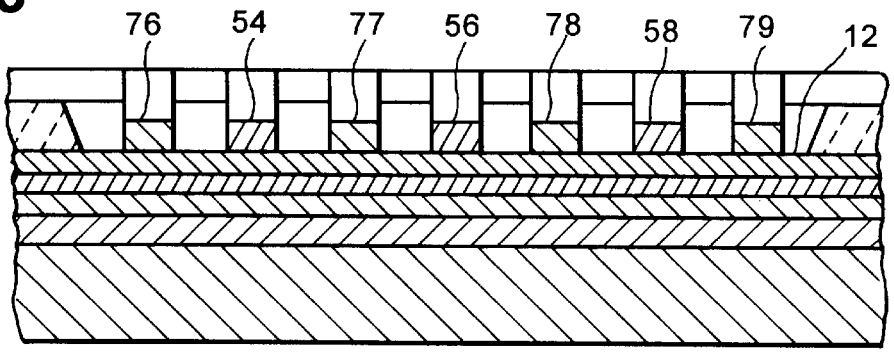
FIG. 6 is a sectional view similar to FIG. 5 showing two sets of electrodes formed thereon.
Figure 7:
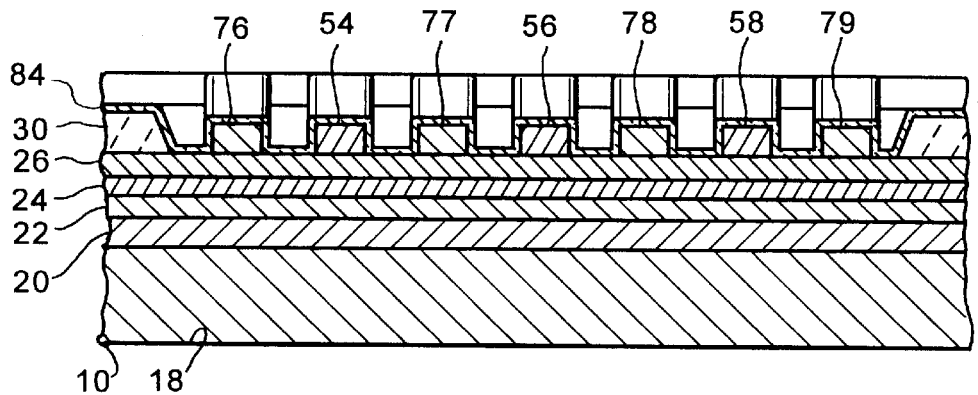
FIG. 7 is a sectional view through the completed photodetector.
Figure 8:
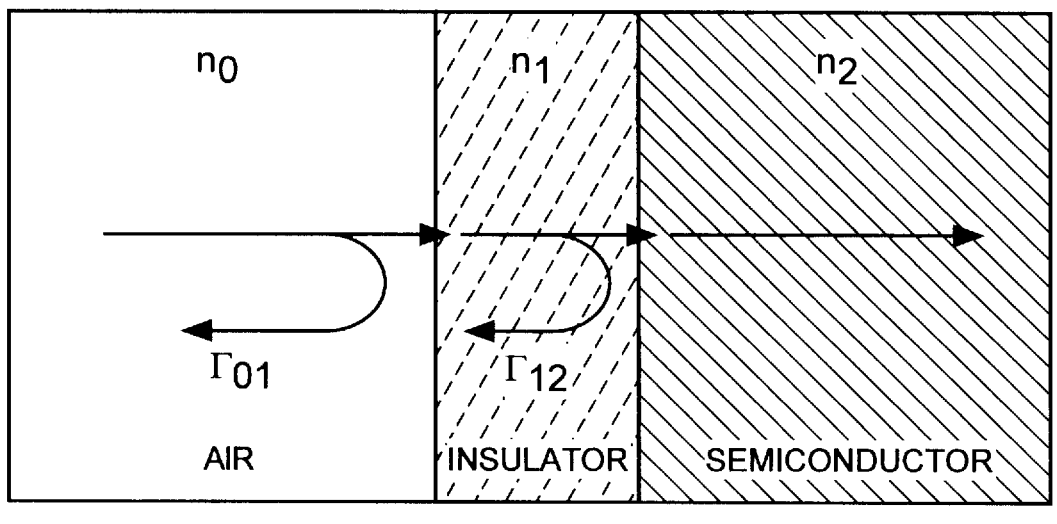
FIG. 8 illustrates the reflectivity and transmission of incoming light through an air insulator semiconductor layer.
Figure 12:
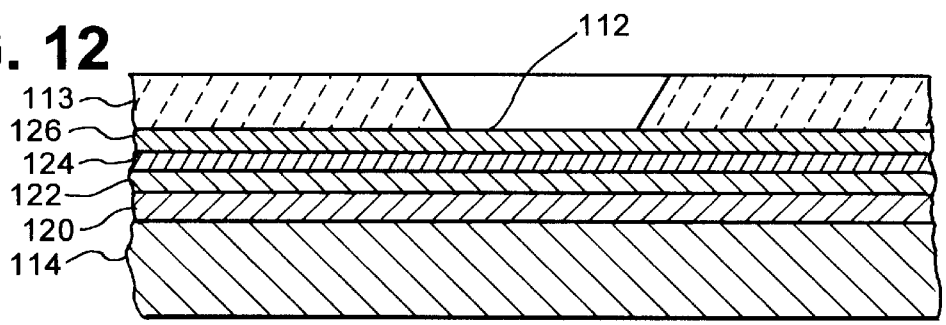
Figure 13:
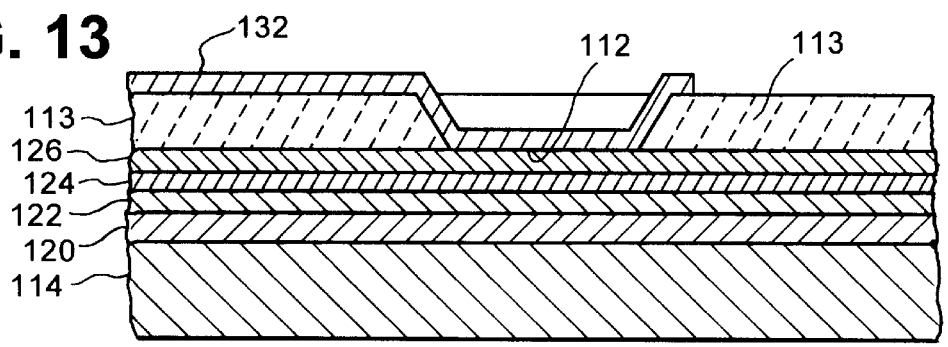
Figure 14:
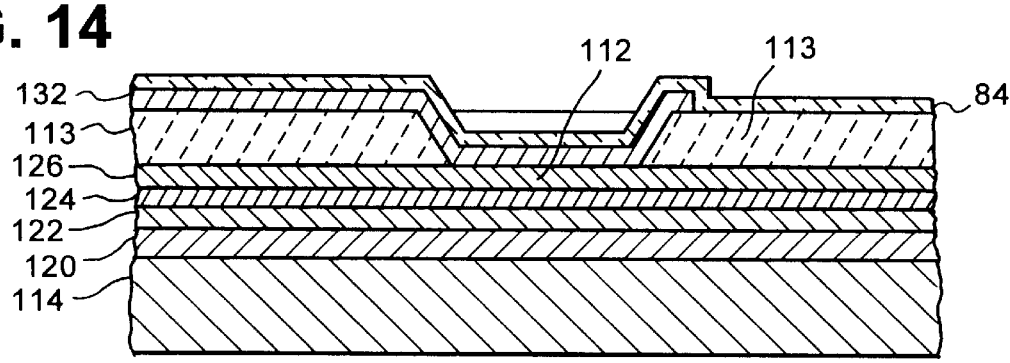

With reference to FIG. 4, a sectional view of the substrate having layers including the buffer layer 20, absorption layer 22, graded layer 24 and contact layer 26 thereon. In FIG. 5, the first set of electrodes is formed, i.e., electrodes 76–79 by photo masking on region 12. In FIG. 6, masking of electrodes 54, 56 and 58 forms the electrodes as contact vias in the active region 12. FIG. 7 shows the passivation layer 84 which includes the silicon nitride anti-reflection coating and passivation material described above. Similarly, the processing steps illustrated in FIGS. 11–14 wherein an isolation region 113 is spaced from the mesa on the substrate layer which includes a buffer layer 120, absorption layer 122, graded layer 124 and contact layer 126. In FIG. 12 etching of the isolation layer 113 exposes active region 112, and in FIG. 13 the contact structure 132 is formed therein. In FIG. 14, the passivation layer 84 of silicon nitride is formed thereon.

Figure 18:
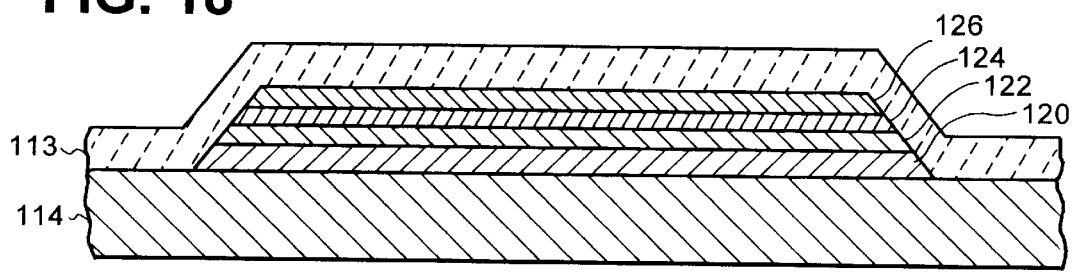
FIG. 18 is a sectional view showing a dielectric layer deposited upon the mesa.
Figure 19:
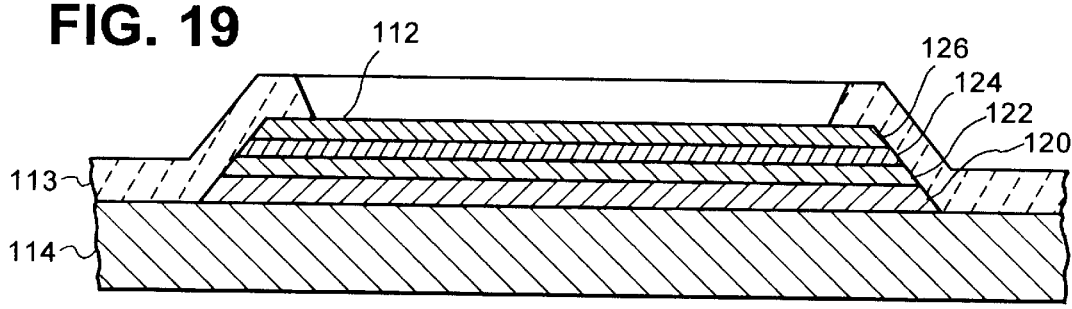
FIG. 19 shows a via etched into the dielectric layer of FIG. 18.
Figure 20:
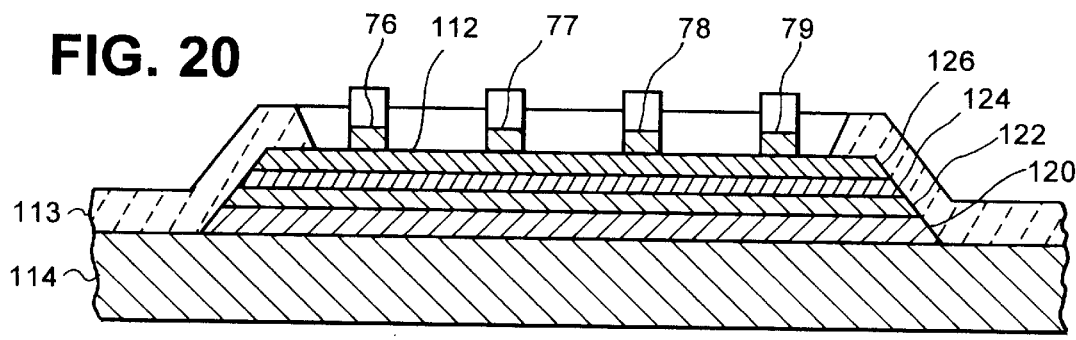
FIG. 20 shows a first pair of electrodes positioned on an active region of the mesa.

Turning now to FIGS. 17–22 and FIGS. 23–27, the processing of mesa formation embodiments are illustrated. Again, buffer layer 120, absorption layer 122, graded layer 124 and contact layer 126 are now provided upon substrate layer 114. In FIG. 18, the isolation region 113 is spaced away from the mesa on the substrate layer 114. In FIG. 19 the isolation layer 113 is etched to expose the active region 112, and in FIG. 20, electrodes 76–79 are formed in the active region 112 using photo masking and etching. In FIG. 21 photo masking of electrodes 54, 56 and 58 is provided and in FIG. 22 the passivation layer 84 is formed thereon.

Figure 23:
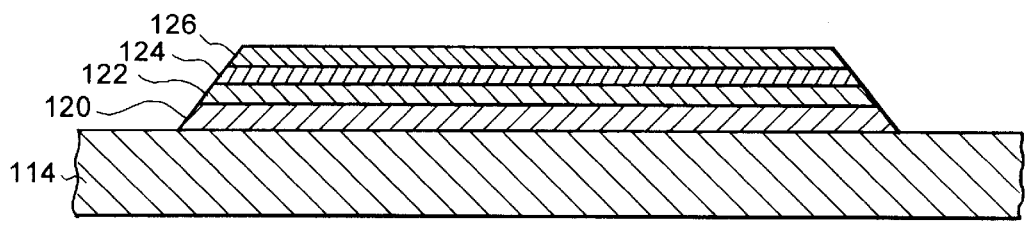
FIGS. 23 through 27 show the mesa structure in the same stages of completion through a section taken at right angles to the section of FIGS. 17 through 22.
Figure 24:
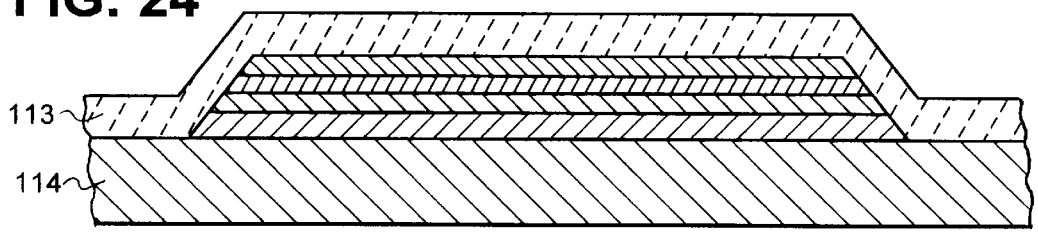
Figure 25:
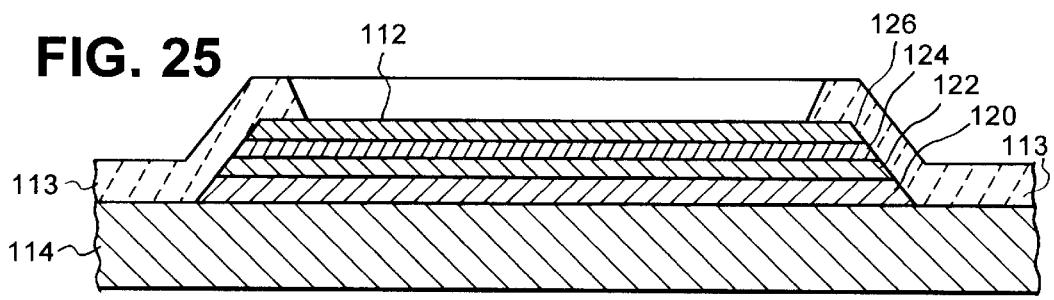
Figure 26:
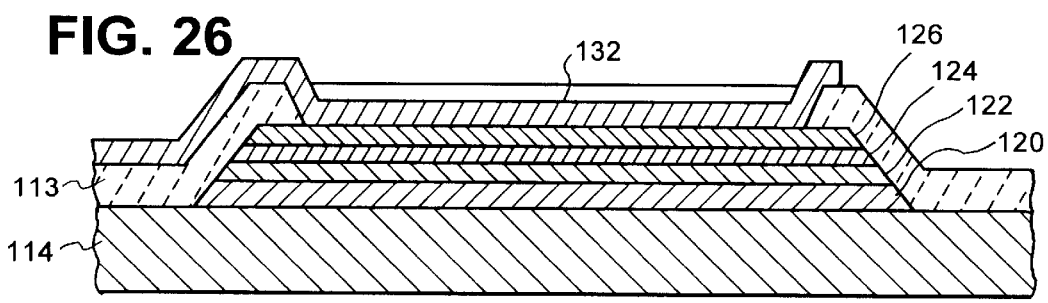
Figure 27:
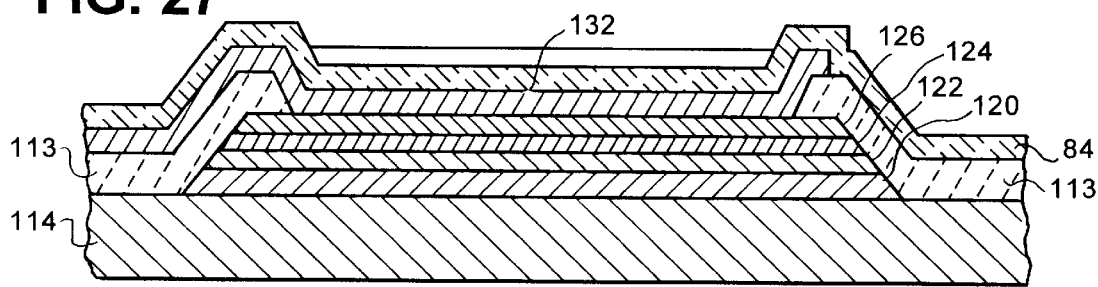

The sectional views of FIGS. 23–27 illustrate the forming of the mesa structure in FIG. 23 on the substrate layer 114; the formation of the isolation region 113 in FIG. 24; the etching of the isolation region 113 to expose the active region 112 in FIG. 25; the formation of the electrode 132 in FIG. 26 and the application of the passivation layer 84 in FIG. 27.

Figure 9:
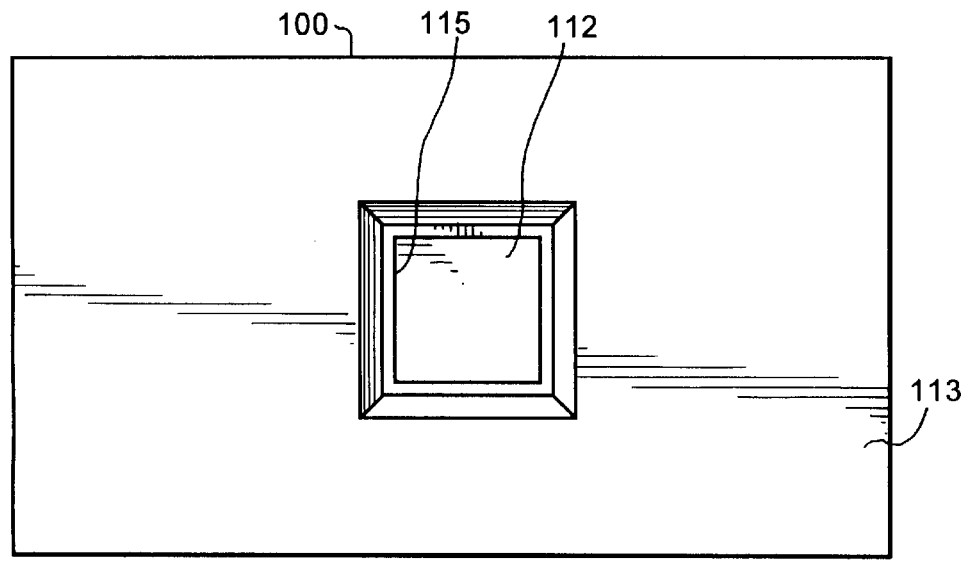
FIG. 9 is an elevational view of a mesa-type low dark current metal-semiconductor-metal photoconductor comprising a second embodiment of the present invention prior to the formation of electrodes thereon.
Figure 10:
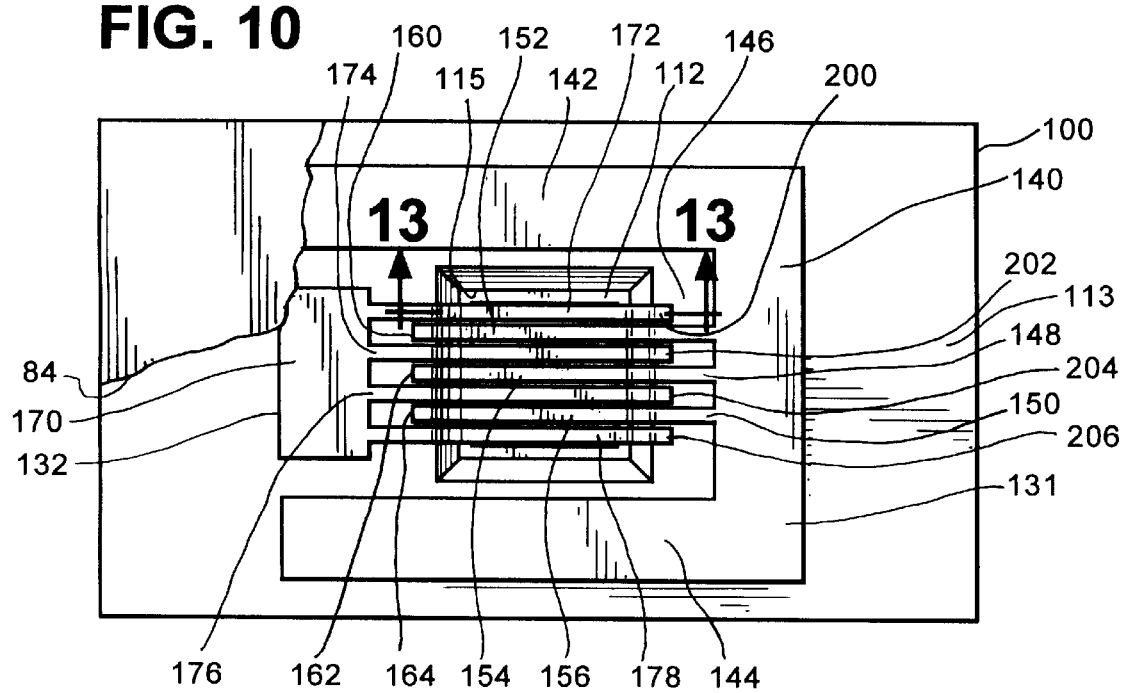
FIG. 10 is an elevational view of the completed mesa-type photodetector.
Figure 11:
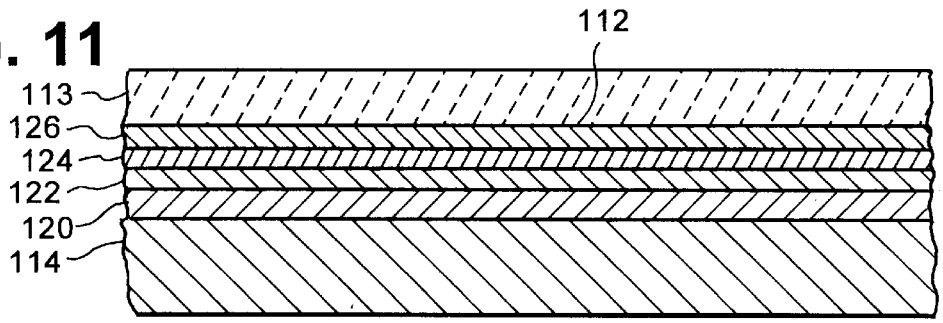
FIGS. 11 through 14 show various details of the stages of fabrication of the photodetector.
Figure 15:
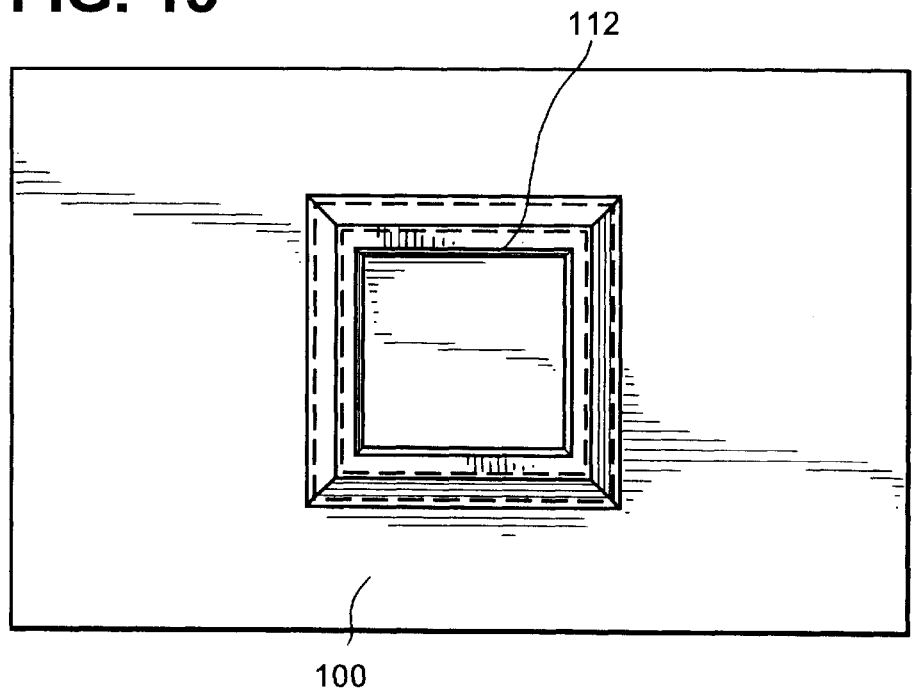
FIG. 15 is an elevational view of mesa structure for a low dark current metal-semiconductor-metal photodetector.
Figure 16:
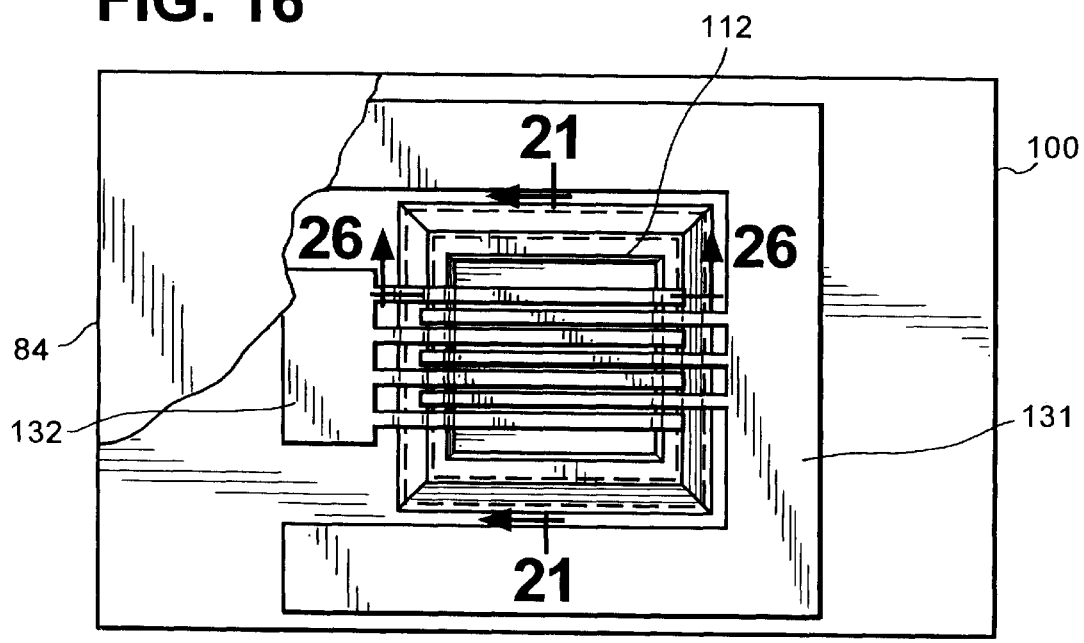
FIG. 16 is a view of a completed photodetector according to the invention shown in FIG. 15.
Figure 17:
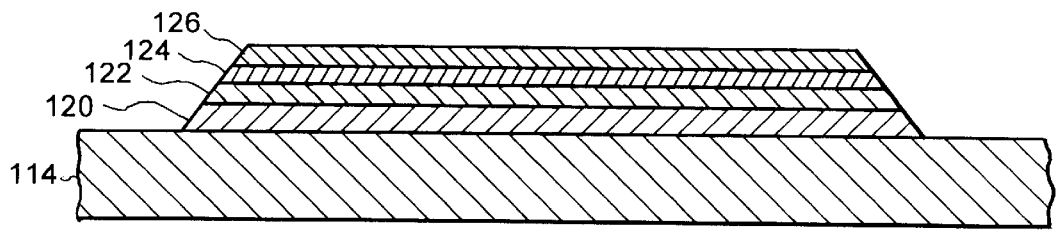
FIG. 17 is a sectional view of the mesa of the photodetector shown in FIG. 15.

Referring now to the drawings and especially FIGS. 9 and 10 and especially to FIGS. 15 and 16, a low dark current metal-semiconductor-metal photodetector 100 is generally shown therein and is of the mesa structure type including an active region 112 and an isolation region 113. In this embodiment the active region 112 comprises a mesa while the isolation region 113 is spaced away from the mesa on a substrate layer. The contact pads and electrode tips are then placed atop a layer of silicon nitride 115 to reduce thermionic emissions at the high field regions near the electrode tips and to eliminate leakage current between the contact pads.

As may best be seen in FIGS. 11 through 14, 17 through 22 and 23 through 27, the device 100 includes an indium phosphide substrate layer 114 doped with iron for providing lattice constant spacing for other layers. A 100 nanometer InAlAs buffer layer 120 is formed by organo-metallic vapor phase epitaxy and/or molecular beam epitaxy on the doped indium phosphide substrate layer 114 to provide electrical isolation from the doped layer 114. An absorption layer 122 comprising InGaAs and having a thickness of about one micron is formed by organo-metallic vapor phase epitaxy and/or molecular beam epitaxy on the InAlAs buffer layer 120. A graded In(Ga, Al)As layer 124 having a thickness of about 50 nanometers is formed by organo-metallic vapor phase epitaxy and/or molecular beam epitaxy on the InGaAs layer 122. An InAlAs contact layer 126 having a thickness of about 50 nanometers is formed on the graded layer 124. A first electrode structure 132 has contact regions formed on the InAlAs layer 126. A second electrode structure 131 has contacts formed on the InAlAs layer 126 in the active region. A silicon nitride capping layer 113 having a thickness of about 200 nanometers is formed by plasma enhanced chemical vapor deposition from silane and ammonia. The silicon nitride capping layer provides a quarter wave interference filter for reducing reflective losses at the air device interface.

The electrode structure 131 includes a contact pad 140 having a pair of sides 142 and 144 and a plurality of fingers 146, 148 and 150 extending therefrom onto the silicon nitride covering the mesa to provide finger contact regions 152, 154 and 156, respectively, with respective tip portions 160, 162 and 164 being on the silicon nitride. Likewise, the electrode 132 includes a crossbar 170 with fingers 172, 174, 176 and 178, having portions in the contact region and having tipped portions 200, 202, 204 and 206 off the mesa in the isolation area 113. The electrode 131 is comprised of cadmium tin oxide which in the portions crossing the active region has its fingers comprised of a substance transparent to 1.55 micron infrared radiation thus providing an enhanced signal-to-noise-ratio by increasing the photon flux striking the active region. The electrode 132 is comprised of titanium and gold having high conductivity to reduce the resistive-capacitive delay of the structure. All of the electrode tips are in the inactive region off the mesa thereby avoiding problems with the electric field bunching in the active region causing high dark currents. In addition, the differing materials have respective high Schottky barriers, as set forth above, to holes and electrons thereby also reducing the dark current.

While there have been illustrated and described particular embodiments of the present invention, it will be appreciated that numerous changes and modifications will occur to those skilled in the art, and it is intended in the appended claims to cover all those changes and modifications which fall within the true spirit and scope of the present invention.

What is claimed is:

1. A low dark current metal-semiconductor-metal photodetector comprising:
   an active region;
   an isolation region proximate with the active region; and
   an electrode having a first portion coupled to the active region, a second portion of said electrode being positioned on the isolation region to reduce the dark current.

2. A low dark current metal-semiconductor-metal photodetector according to claim 1 wherein said active region is defined by a dielectric layer in contact with a semiconductor layer, said dielectric layer having a via form therein and said first portion of electrode of said electrode extending into the via in contact with the semiconductor said second portion of said electrode being positioned on the dielectric layer.

3. A low dark current metal-semiconductor-metal photodetector according to claim 2 wherein said dielectric comprises silicon nitride.

4. A low dark current metal-semiconductor-metal photodetector according to claim 2 wherein said electrode comprises a material which is transparent to impinging photons.

5. A low dark current metal-semiconductor-metal photodetector according to claim 2, wherein said semiconductor comprises a III–V semiconductor.

6. A low dark current metal-semiconductor-metal photodetector according to claim 2, wherein said electrode comprises cadmium tin oxide which is transparent to infrared radiation.

7. A low dark current metal-semiconductor-metal photodetector according to claim 2, wherein said electrode comprises a material which is substantially opaque to impinging photons.

8. A low dark metal-semiconductor-metal photodetector comprising:
   an active region;
   a first electrode extending in contact with the active region, said first electrode being substantially transparent and exhibiting a first Schottky barrier characteristic; and
   a second electrode comprised of a material different than the first electrode and having a high Schottky barrier characteristic when in combination with the absorption layer for the opposite charge carrier, so that the high Schottky barriers for holes and electrons exhibited by electrodes reduces the dark current and enhances the signal to noise ratio of the photodetector.

9. A low dark current metal-semiconductor-metal photodetector according to claim 8, wherein said second electrode comprises a material which is substantially opaque to impinging photons.

10. A low dark current metal-semiconductor-metal photodetector according to claim 8 wherein said active region is defined by a dielectric layer in contact with a semiconductor layer, said dielectric layer having a via form therein and said first portion of electrode of said electrode extending into the via in contact with the semiconductor said second portion of said electrode being positioned on the dielectric layer.

11. A low dark current metal-semiconductor-metal photodetector according to claim 10 wherein said dielectric comprises silicon nitride.

12. A low dark current metal-semiconductor-metal photodetector according to claim 10 wherein said electrode comprises a material which is transparent to impinging photons.

13. A low dark current metal-semiconductor-metal photodetector according to claim 10, wherein said semiconductor comprises a III–V semiconductor.

14. A low dark current metal-semiconductor-metal photodetector according to claim 10, wherein said electrode comprises cadmium tin oxide which is transparent to infrared radiation.

15. A low dark metal-semiconductor-metal photodetector comprising:
   an active region;
   a first electrode extending in contact with the active region, said first electrode being substantially opaque to impinging photons and exhibiting a first Schottky barrier characteristic; and
   a second electrode comprised of a material different than the first electrode and having a high Schottky barrier characteristic when in combination with the absorption layer for the opposite charge carrier, so that the high Schottky barriers for holes and electrons exhibited by electrodes reduces the dark current and enhances the signal to noise ratio of the photodetector, said second electrode being substantially opaque to impinging photons.

16. A low dark current metal semiconductor metal photodetector comprising:
   an active region for generating electrons and holes from absorbed photons;
   a dielectric layer coupled to said active region having an opening formed therein;
   a first electrode having a connector region positioned on the dielectric and a contact region positioned on the active region with a contact termination region coupled to the active region being positioned on the isolation region, said first electrode being substantially transparent to photons and providing a Schottky barrier for one of the electrons or holes; and
   a second electrode having a contact pad positioned on the isolation region with a contact region extending onto the active region and terminating at a contact termination on the isolation region, the second electrode providing a high Schottky barrier for the other of the charge carriers so that each of the electrodes provides a high Schottky barrier for one of the charge carriers thereby reducing the dark current.

17. A low dark current metal-semiconductor-metal photodetector according to claim 16 wherein said dielectric comprises silicon nitride.

18. A low dark current metal-semiconductor-metal photodetector according to claim 16 wherein said electrode comprises a material which is transparent to impinging photons.

19. A low dark current metal-semiconductor-metal photodetector according to claim 16, wherein said semiconductor comprises a III–V semiconductor.

20. A low dark current metal-semiconductor-metal photodetector according to claim 16, wherein said electrode comprises cadmium tin oxide which is transparent to infrared radiation.

21. A low dark current metal-semiconductor-metal photodetector according to claim 16, wherein said second electrode comprises a material which is substantially opaque to impinging photons.

22. A low dark current metal semiconductor metal photodetector comprising:

an active region for generating electrons and holes from absorbed photons;

a dielectric layer coupled to said active region having an opening formed therein;

a first electrode having a connector region positioned on the dielectric and a contact region positioned on the active region with a contact termination region coupled to the active region being positioned on the isolation region, said first electrode being substantially opaque to impinging photons and providing a Schottky barrier for one of the electrons or holes; and a second electrode having a contact pad positioned on the isolation region with a contact region extending onto the active region and terminating at a contact termination on the isolation region, the second electrode providing a high Schottky barrier for the other of the charge carriers so that each of the electrodes provides a high Schottky barrier for one of the charge carriers thereby reducing the dark current, said second electrode being substantially opaque to impinging photons.

* * * * *

UNITED STATES PATENT AND TRADEMARK OFFICE
CERTIFICATE OF CORRECTION

PATENT NO. : 5,880,482
DATED : March 9, 1999
INVENTOR(S) : Adesida et al.

It is certified that error appears in the above-identified patent and that said Letters Patent is hereby corrected as shown below:

On Column 1, after the title, LOW DARK CURRENT PHOTODETECTOR", and before the paragraph "BACKGROUND OF THE INVENTION", please insert --The research that led to this patent was funded, in part, by the National Science Foundation and the Department of the Army under Advanced Research Projects Agency Grant MDA 972-941-0004. The National Science Foundation and the Department of the Army may retain certain rights under this patent.--

Signed and Sealed this

Fifteenth Day of February, 2000

*Attest:*

Q. TODD DICKINSON

*Attesting Officer*     *Commissioner of Patents and Trademarks*